United States Patent
Chen et al.

(10) Patent No.: US 8,799,834 B1
(45) Date of Patent: Aug. 5, 2014

(54) SELF-ALIGNED MULTIPLE PATTERNING LAYOUT DESIGN

(71) Applicant: Taiwan Semiconductor Manufacturing Company Limited, Hsin-Chu (TW)

(72) Inventors: Huang-Yu Chen, Zhudong Township (TW); Li-Chun Tien, Tainan (TW); Ken-Hsien Hsieh, Taipei (TW); Jhih-Jian Wang, Taiping (TW); Chin-Chang Hsu, Banqiao (TW); Chin-Hsiung Hsu, Guanyin Township (TW); Pin-Dai Sue, Tainan (TW); Ru-Gun Liu, Zhubei (TW); Lee-Chung Lu, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/753,789

(22) Filed: Jan. 30, 2013

(51) Int. Cl.
*G06F 17/50* (2006.01)

(52) U.S. Cl.
USPC ............ 716/55; 716/51; 716/52; 716/53; 716/54; 716/56; 430/5; 430/30

(58) Field of Classification Search
USPC ..................... 716/50–56; 430/5, 30
See application file for complete search history.

(56) References Cited

U.S. PATENT DOCUMENTS

| | | | | |
|---|---|---|---|---|
| 6,664,010 B2 * | 12/2003 | Ahrens et al. | | 430/5 |
| 7,611,941 B1 * | 11/2009 | Shum et al. | | 438/201 |
| 7,856,613 B1 * | 12/2010 | Weling et al. | | 716/55 |
| 7,926,001 B2 * | 4/2011 | Pierrat | | 716/50 |
| 8,298,953 B2 * | 10/2012 | Haffner | | 438/703 |
| 8,312,394 B2 * | 11/2012 | Ban et al. | | 716/50 |
| 8,415,089 B1 * | 4/2013 | Gupta et al. | | 430/311 |
| 8,558,322 B2 * | 10/2013 | Becker et al. | | 257/401 |
| 2004/0259042 A1 * | 12/2004 | Fritze et al. | | 430/394 |
| 2008/0131788 A1 * | 6/2008 | Vickery | | 430/5 |
| 2008/0134129 A1 * | 6/2008 | Vickery | | 716/20 |
| 2009/0146322 A1 * | 6/2009 | Weling et al. | | 257/786 |
| 2009/0263749 A1 * | 10/2009 | Sim et al. | | 430/319 |
| 2011/0012237 A1 * | 1/2011 | Pierrat | | 257/618 |
| 2011/0193234 A1 | 8/2011 | Chen et al. | | |
| 2011/0318927 A1 * | 12/2011 | Li et al. | | 438/692 |
| 2012/0074499 A1 * | 3/2012 | Haffner et al. | | 257/368 |
| 2012/0094492 A1 * | 4/2012 | Park et al. | | 438/694 |
| 2012/0137261 A1 * | 5/2012 | Ban et al. | | 716/52 |
| 2012/0180006 A1 * | 7/2012 | Baum et al. | | 716/52 |
| 2012/0192124 A1 * | 7/2012 | Bruce et al. | | 716/54 |

OTHER PUBLICATIONS

"Self-Aligned Double Patterning (SADP) Layout Decomposition", by Minoo Mirsaeedi, J. Andres Torres, and Mohab Anis, IEEE @2011.*

* cited by examiner

*Primary Examiner* — Nha Nguyen
(74) *Attorney, Agent, or Firm* — Cooper Legal Group LLC

(57) ABSTRACT

Among other things, one or more techniques and systems for performing design layout are provided. An initial design layout is associated with an electrical component, such as a standard cell. The initial design layout comprises a first pattern, such as a mandrel pattern, and a second pattern, such as a passive fill pattern. An initial cut pattern is generated for the initial design layout. Responsive to identifying a design rule violation associated with the initial cut pattern, the initial design layout is modified to generate a modified initial design layout. An updated cut pattern, not resulting in the design rule violation, is generated based upon the modified initial design layout. The updated cut pattern is applied to the modified initial design layout to generate a final design layout. The final design layout can be verified as self-aligned multiple patterning (SAMP) compliant.

20 Claims, 13 Drawing Sheets

SELF-ALIGNED MULTIPLE PATTERNING LAYOUT DESIGN

BACKGROUND

Electronic design tools allow designers to layout, simulate, and analyze electrical components, such as standard cells and integrated circuits. In an example, a designer may create a design layout for a standard cell. Once the design layout is complete, complex post processing is used to make the design layout self-aligned multiple patterning (SAMP) compliant. For example, the design layout is adjusted using mandrel pattern and passive fill pattern. During fabrication, a trim mask or a cut mask is used to either retain a portion of the design layout corresponding to the electrical component or to remove a portion of the design layout that does not correspond to the electrical component.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more techniques and systems for performing design layout are provided herein. In some embodiments, the design layout corresponds to an electrical component, such as a standard cell configured to provide logic-based functionality or storage functionality. The electrical component can be designed using at least one of a mandrel pattern or a passive fill pattern. Because the design layout can conflict with physical limitations of a cut mask used to remove unwanted portions of the design layout during fabrication, a design rule violation, such as a violation of a sizing constraint associated with the cut mask, may be identified and resolved for verification of the design layout as self-aligned multiple patterning (SAMP) compliant as provided herein. It is appreciated that the techniques described herein are not limited to a cut mask used to remove unwanted portions of the design layout, but also apply to a trim mask used to retain desired portions of the design layout.

In some embodiments, an initial design layout associated with an electrical component is received. The initial design layout comprises a first pattern associated with a first pattern process, such as one or more polygons corresponding to a passive fill pattern process, and a second pattern associated with a second pattern process, such as one or more polygons corresponding to a mandrel pattern process that represents polygons as mandrel surrounded by spacer. For example, a multiple-patterning technology (MPT) compliant layout is decomposed into one or more pattern groups, such that a first pattern group is assigned to the first pattern process, and one or more additional pattern groups are assigned to the second pattern process. An initial cut pattern is generated for the initial design layout. The initial cut pattern corresponds to one or more portions of the initial design layout that are to be removed during formation of the electrical component. One or more sizing constraints, such as a minimum width constraint, a minimum length constraint, etc., are used to identify whether the initial cut pattern has a design rule violation.

Responsive to identifying a design rule violation associated with the initial cut pattern, the initial design layout is modified to generate a modified initial design layout. In an example, a shape, size, or configuration of the first pattern, such as a first polygon of the first pattern, is modified. In another example, a shape, size, or configuration of the second pattern, such as a second polygon of the second pattern, is modified. In another example, an assist mandrel, such as a dummy mandrel, is inserted into the design layout. In this way, the modified initial design layout is generated.

An updated cut pattern is generated based upon the modified initial design layout. Because of the modifications within the modified initial design layout, the updated cut pattern does not result in the design rule violation. In an example, the updated cut pattern is modified based upon at least one of a lithography aware optimization or an electrical-rule aware optimization. In another example, a first portion, but not a second portion of the updated cut pattern is selectively used to generate a final cut pattern based upon an electrical isolation rule between polygons associated with the modified design layout. That is, the final cut pattern provides electrical isolation between one or more polygons representing the electrical component using passive fill pattern for isolation. The updated cut pattern or the final cut pattern is applied to the modified initial design layout to generate a final design layout. In an example, the final design layout is verified as self-aligned multiple patterning (SAMP) compliant. In some embodiments, the updated cut pattern or the final cut pattern are used to generate a trim pattern that is applied to the modified initial design layout to generate the final layout.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
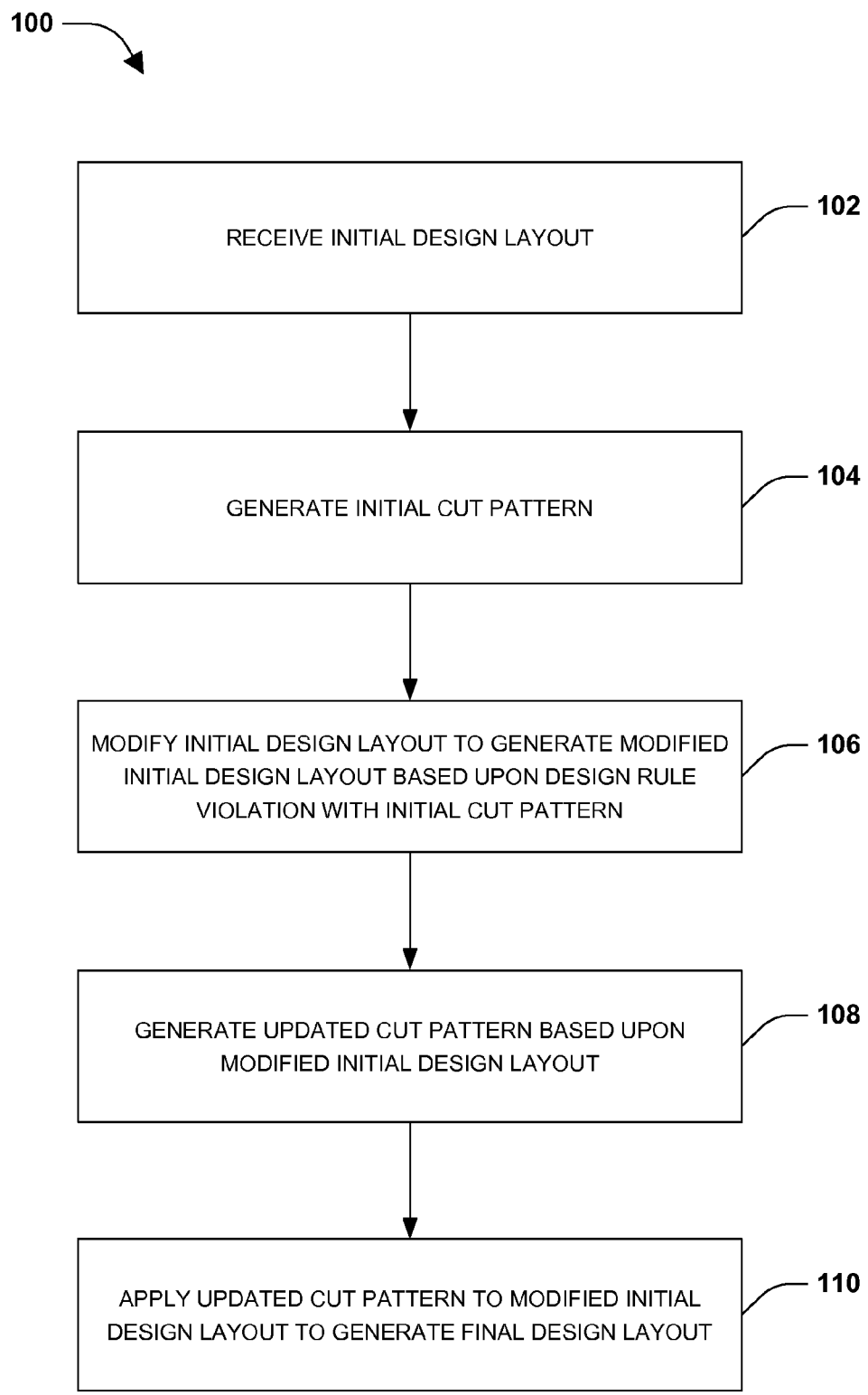
FIG. 1 is a flow diagram illustrating a method of performing design layout, according to some embodiments.
Figure 2:
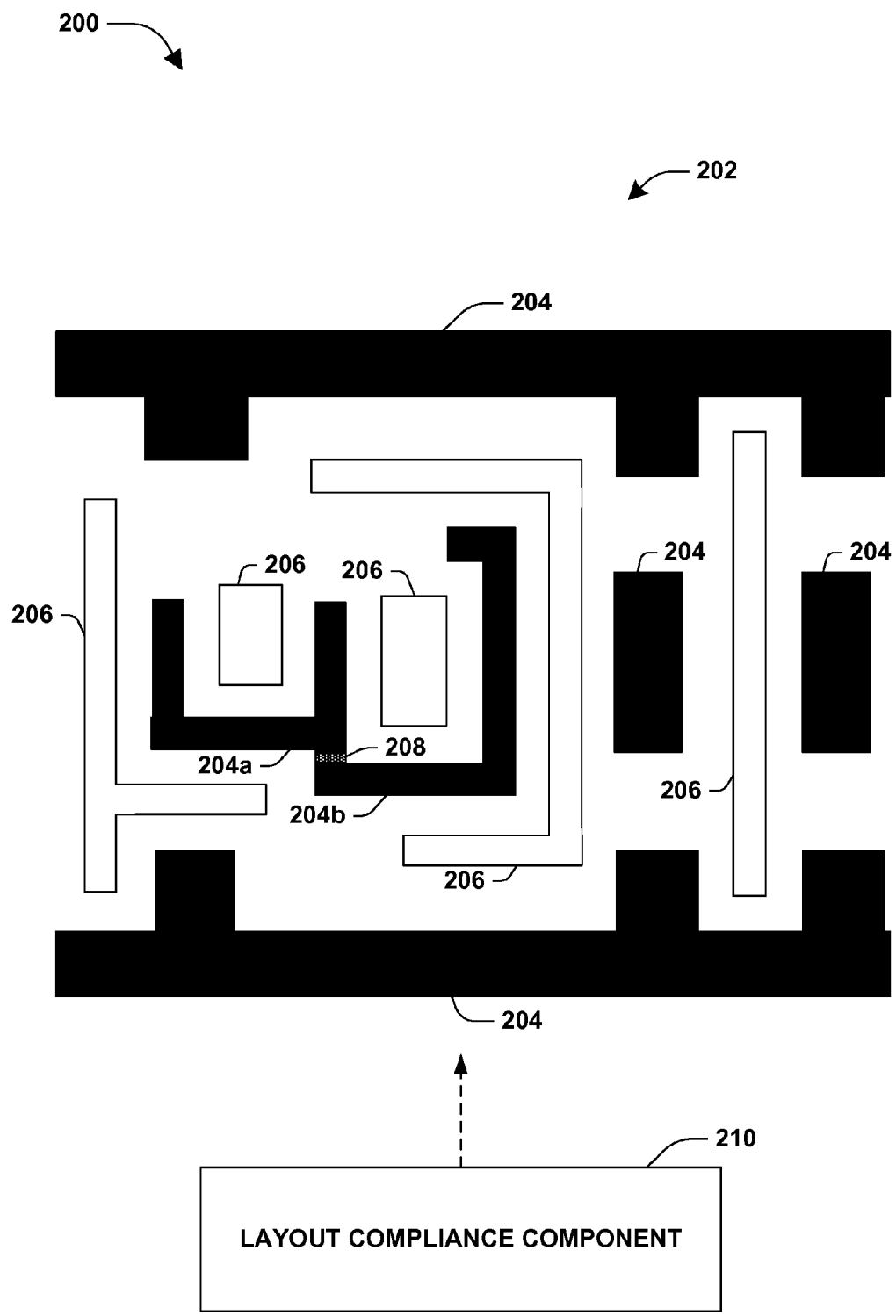
FIG. 2 is a simplified top-down views of a design layout, according to some embodiments.
Figure 3:
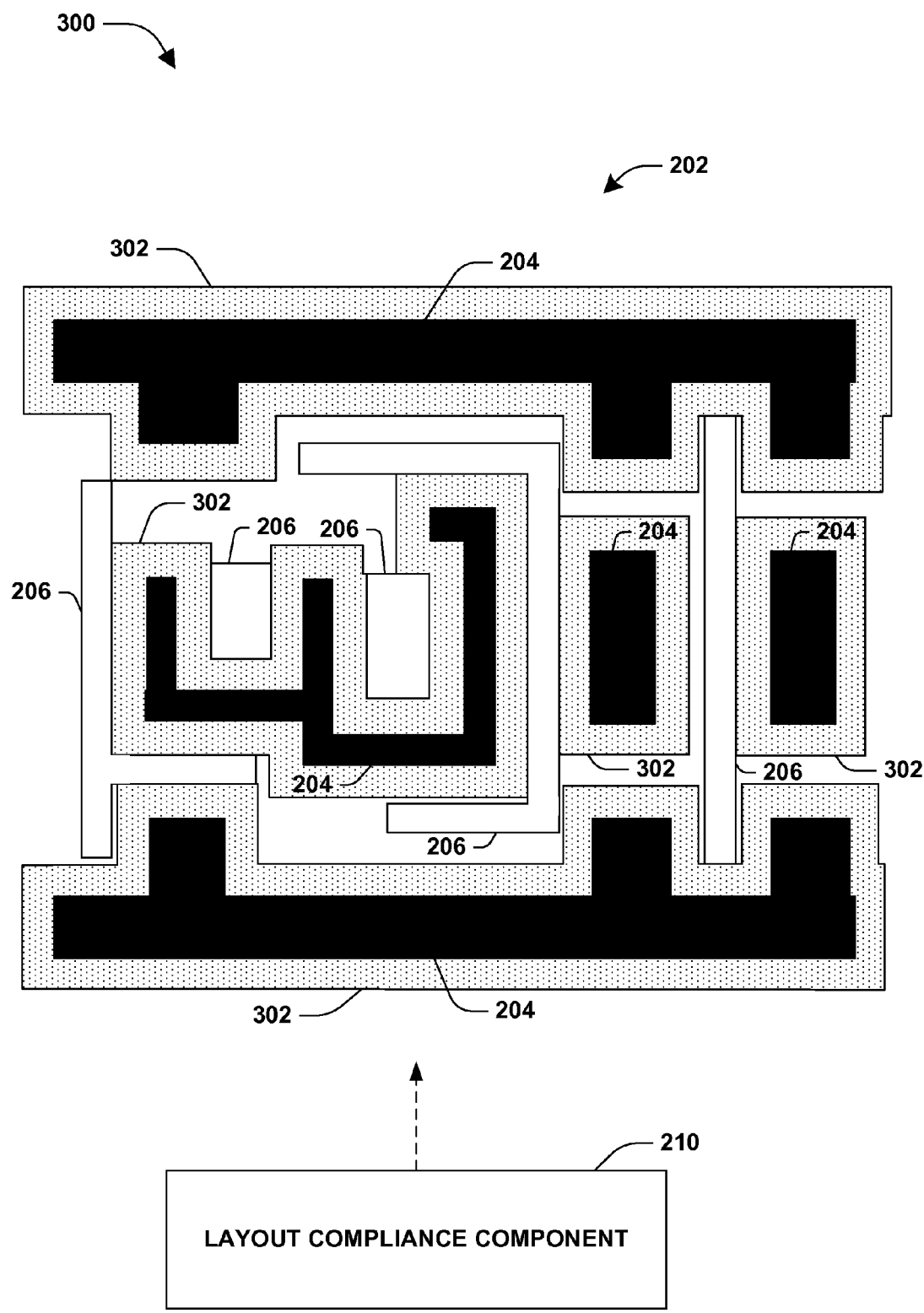
FIG. 3 is a simplified top-down views of a design layout, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

A method 100 of performing design layout, according to some embodiments, is illustrated in FIG. 1, and exemplary design layouts evaluated by such a methodology are illustrated in FIGS. 2-7B. At 102, an initial design layout 202 associated with an electrical component, such as a standard cell, is received. In some embodiments, a layout compliance component 210 in example 200 of FIG. 2 receives the initial design layout 202. The initial design layout 202 comprises one or more polygons that are to be formed to create the electrical component. For example, the initial design layout 202 comprises a first pattern 206 associated with a first pattern process, such as one or more polygons that are to be formed by a passive fill pattern process. The initial design layout 202 comprise a second pattern 204 associated with a second pattern process, such as one or more polygons that are to be formed by a mandrel formation pattern process. In an example, the second pattern 204 is associated with one or more mandrel pattern masks, such that a first portion 204a of the second pattern 204 is formed using a first mandrel mask, and a second portion 204b of the second pattern is formed using a second mandrel mask. A stitch 208 is used to combine the first portion 204a and the second portion 204b. In an example of receiving the initial design layout 202, a multiple-patterning technology (MPT) compliant layout is received. The MPT compliant layout is decomposed into two or more pattern groups, such as groupings of one or more polygons. A first pattern group is assigned to the first pattern process to generate the first pattern 206. One or more additional pattern groups are assigned to the second pattern process to generate the second pattern 204. In this way, the initial design layout 202 is generated.

In some embodiments, the second pattern 204 comprises mandrel that is surrounded by spacer 302. In some embodiments, the layout compliance component 210 in example 300 of FIG. 3 defines the spacer 302 within the initial design layout 202. During fabrication, the spacer 302 is grown, relatively uniformly, around the mandrel portion of the second pattern 204. Unwanted portions of the initial design layout 202 that are not used for the electrical component, such as a region that is not associated with the first pattern 206, the second pattern 204, or the spacer 302, are designated by a cut pattern for removal by one or more cut masks.

At 104, an initial cut pattern 402 is generated for the initial design layout 202. In some embodiments, the layout compliance component 210 in example 400 of FIG. 4A generates the initial cut pattern 402. In an example, the initial cut pattern 402 is used to remove regions of the initial design layout 202 that are not used to form the electrical component during fabrication. The initial cut pattern 402 corresponds to one or more cut masks that are used during fabrication to remove the unwanted regions. Because a cut mask has physical limitations that can otherwise result in tearing or other damage to the cut mask if particular sizing constraints are not met by the initial cut pattern 402, the initial cut pattern 402 is evaluated to identify a design rule violation.

Figure 4A:
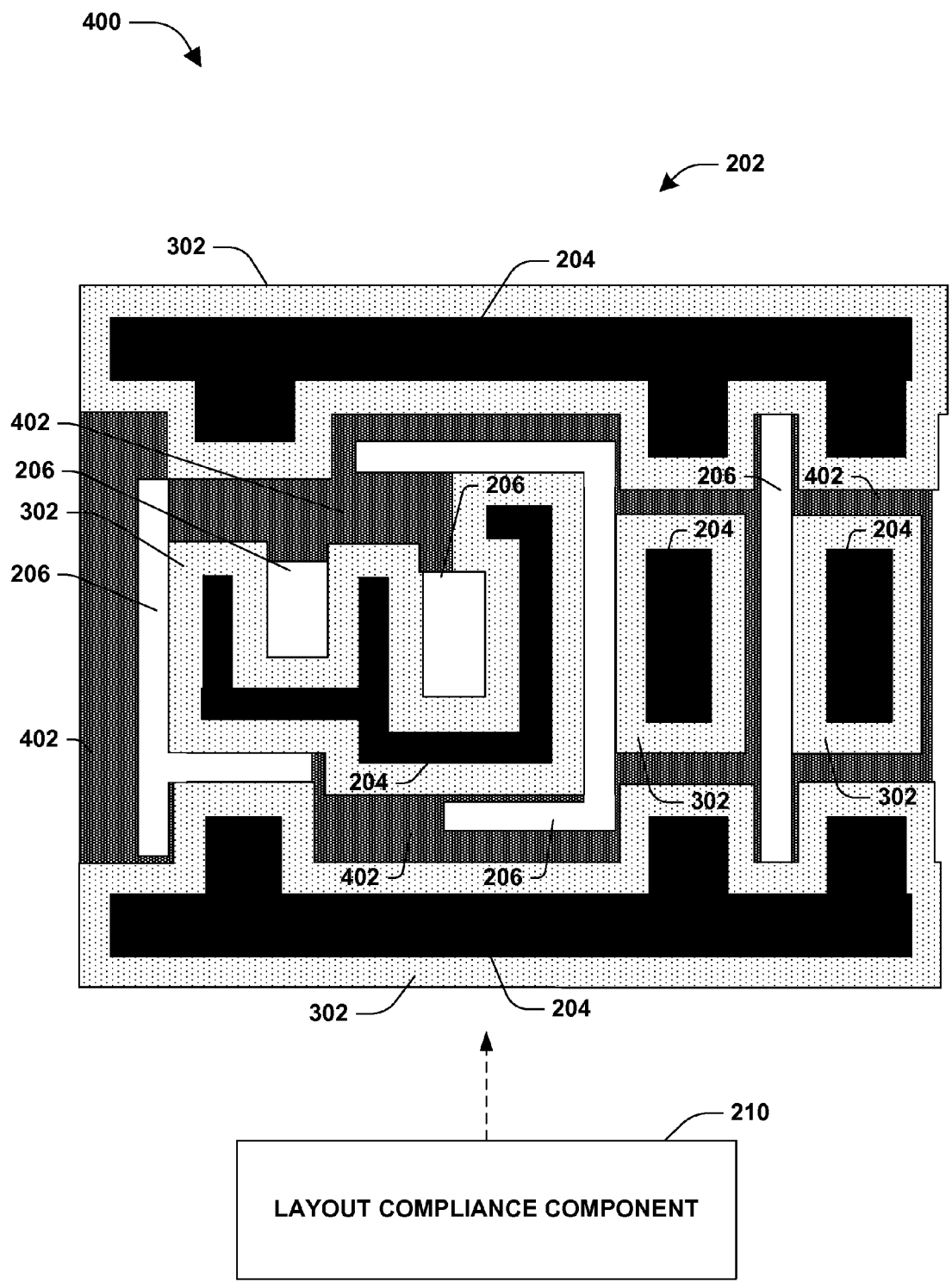
FIG. 4A is a simplified top-down views of a design layout, according to some embodiments.
Figure 4B:
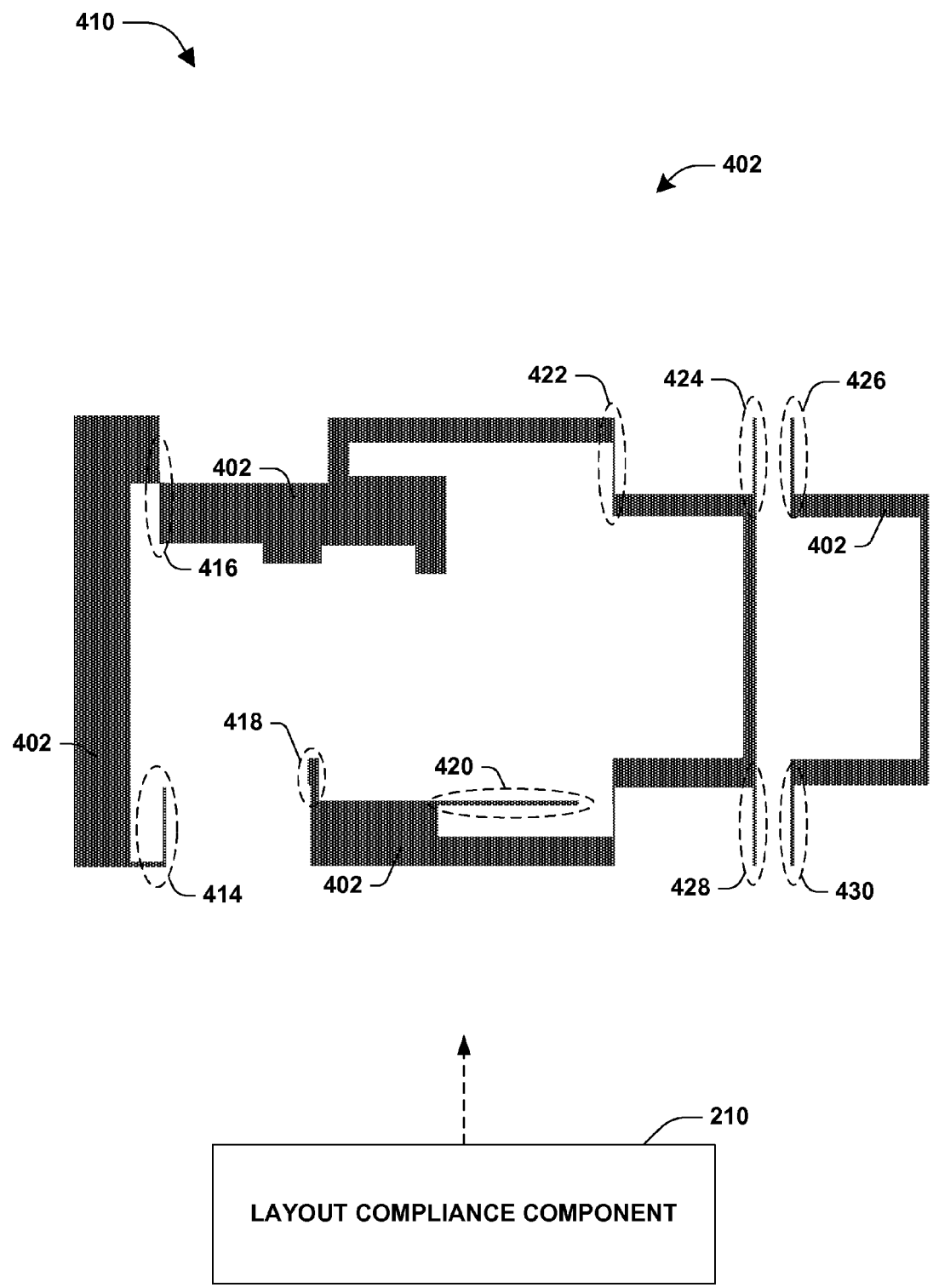
FIG. 4B is a simplified top-down views of a design layout, according to some embodiments.
Figure 5A:
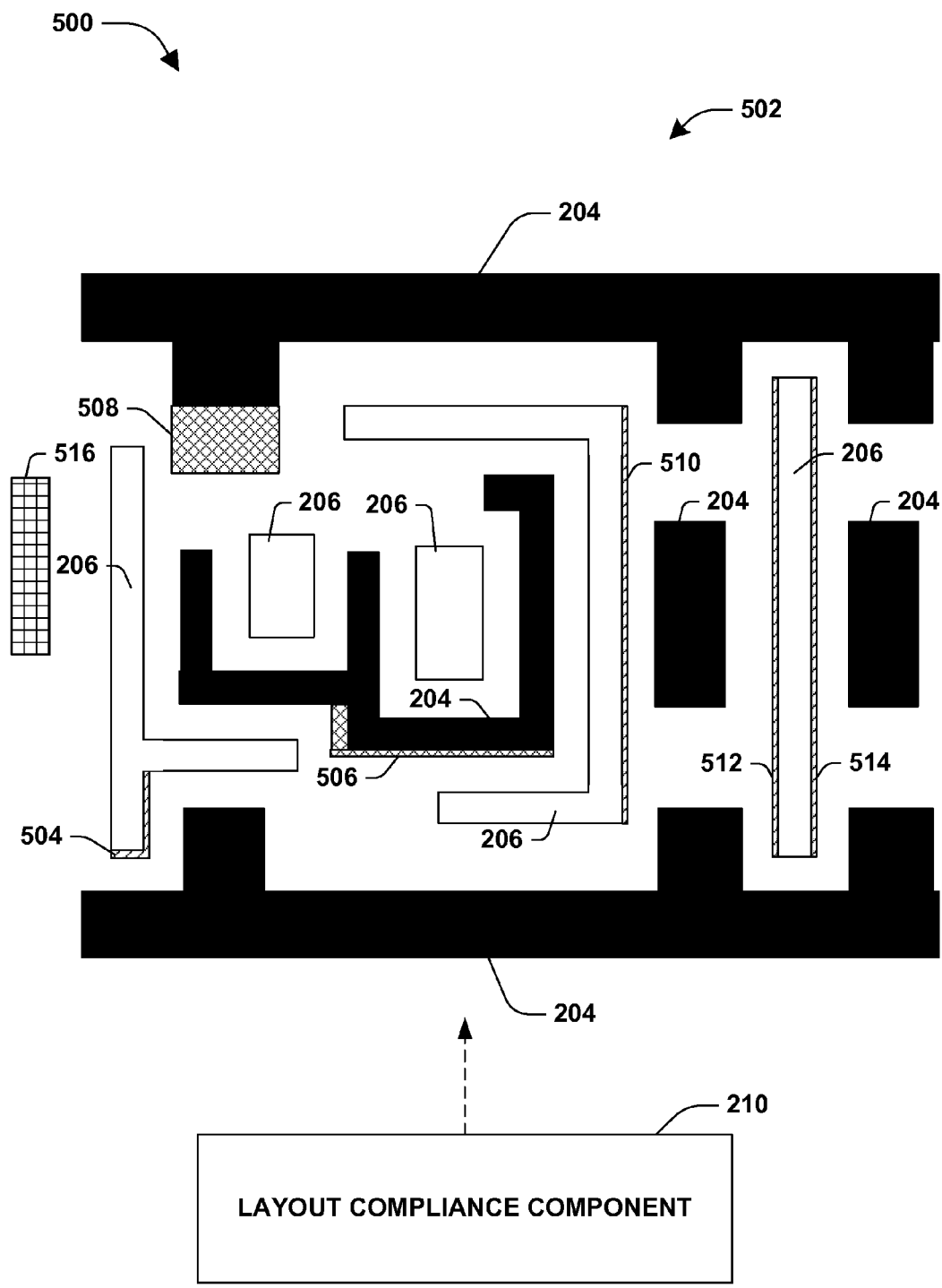
FIG. 5A is a simplified top-down views of a design layout, according to some embodiments.

At 106, responsive to identifying a design rule violation associated with the initial cut pattern 402, the initial design layout 202 is modified to generate a modified initial design layout 502 in example 500 of FIG. 5A. In some embodiments, the layout compliance component 210 in example 410 of FIG. 4B is configured to identify the design rule violation associated with the initial cut pattern 402. In an example, a first design rule violation 414, a second design rule violation 420, a third design rule violation 422, a fourth design rule violation 424, a fifth design rule violation 426, a sixth design rule violation 428, and a seventh design rule violation 430 are identified based upon a sizing constraint corresponding to a minimum width for a cut pattern region. An eighth design rule violation 416 is identified based upon a sizing constraint corresponding to a minimum surface area connecting two portions of the cut mask. A ninth design rule violation 418 is identified based upon other constraints corresponding to the physical formation or use of a cut mask.

Figure 5B:
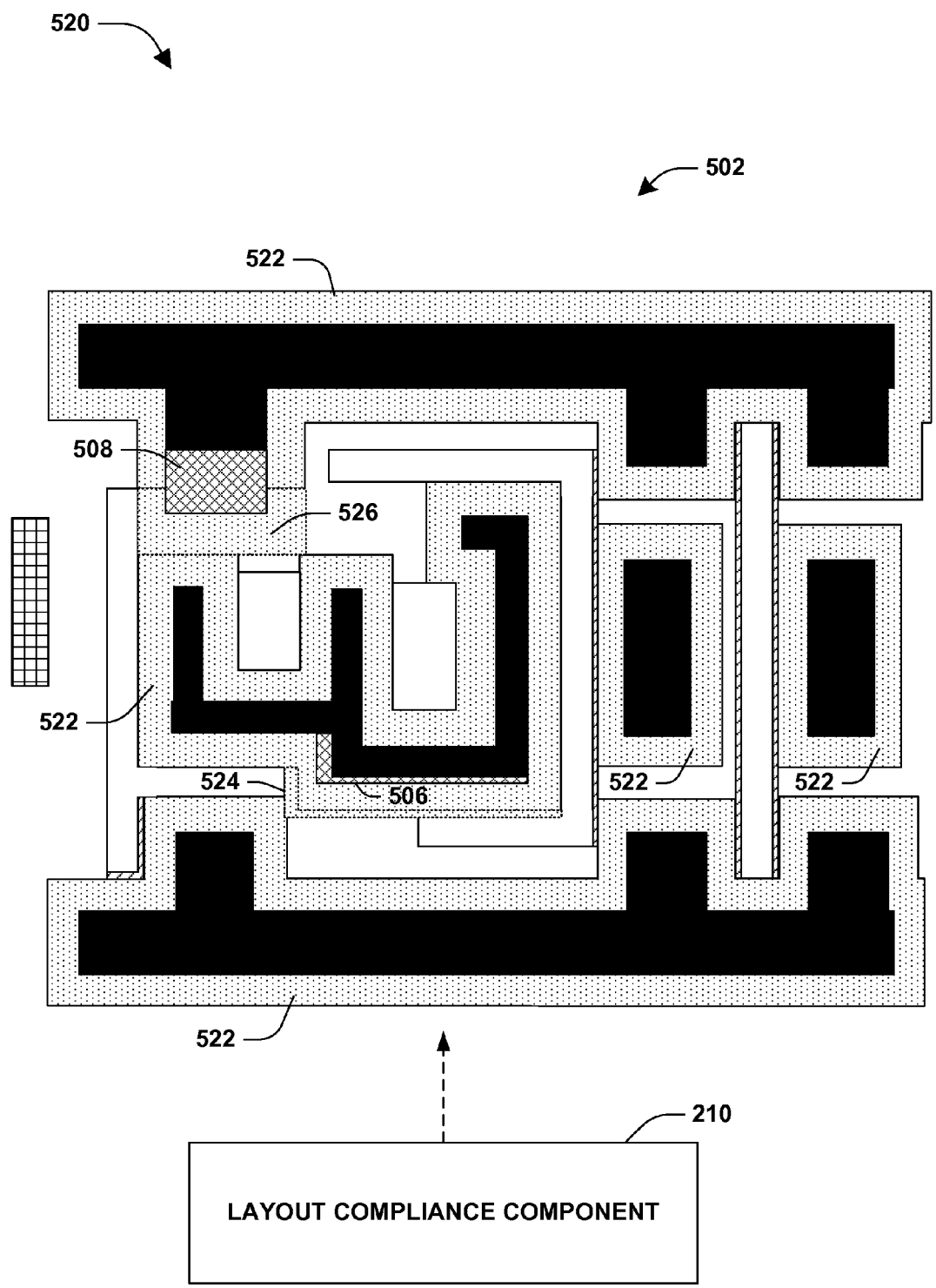
FIG. 5B is a simplified top-down views of a design layout, according to some embodiments.

In some embodiments, the layout compliance component 210 in example 500 of FIG. 5A is configured to modify the initial design layout 202 to generate the modified initial design layout 502. In an example, at least one of a shape or size of the first pattern 206 is modified. For example, a first passive pattern addition 504, a second passive pattern addition 510, a third passive pattern addition 512, and a fourth passive pattern addition 514 are added to the first pattern 206. In another example, at least one of a shape or size of the second pattern 204 is modified. For example, a first mandrel pattern addition 506 and a second mandrel pattern addition 508 are added to the second pattern 204. In another example, an assist mandrel 516, such as a dummy mandrel, is inserted into the initial design layout 202 to generate the modified initial design layout 502. In this way, the modified initial design layout 502 is generated. In some embodiments, the layout compliance component 210 in example 520 of FIG. 5B is configured to update the spacer 302 of the initial design layout 202 based upon the modified initial design layout 502 to generate updated spacer 522 for the modified initial design layout 502. In an example, a first updated spacer 524 is added to the spacer 302 based upon the first mandrel pattern addition 506. In another example, a second updated spacer 526 is added to the spacer 302 based upon the second mandrel pattern addition 508. In this way, the modified initial design layout 502 comprises the updated spacer 522 formed around the second pattern 204, such as a mandrel pattern.

Figure 5C:
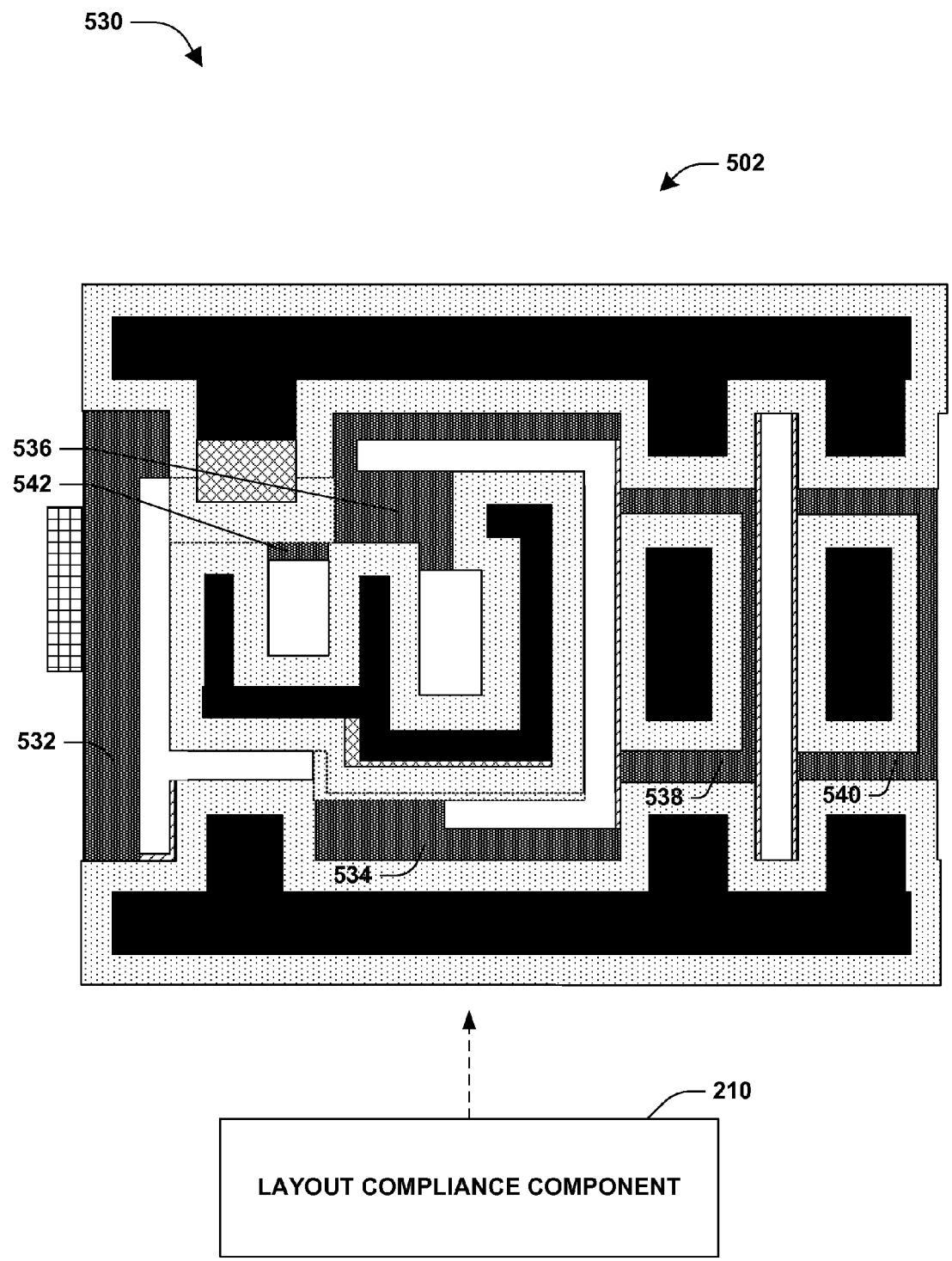
FIG. 5C is a simplified top-down views of a design layout, according to some embodiments.
Figure 6:
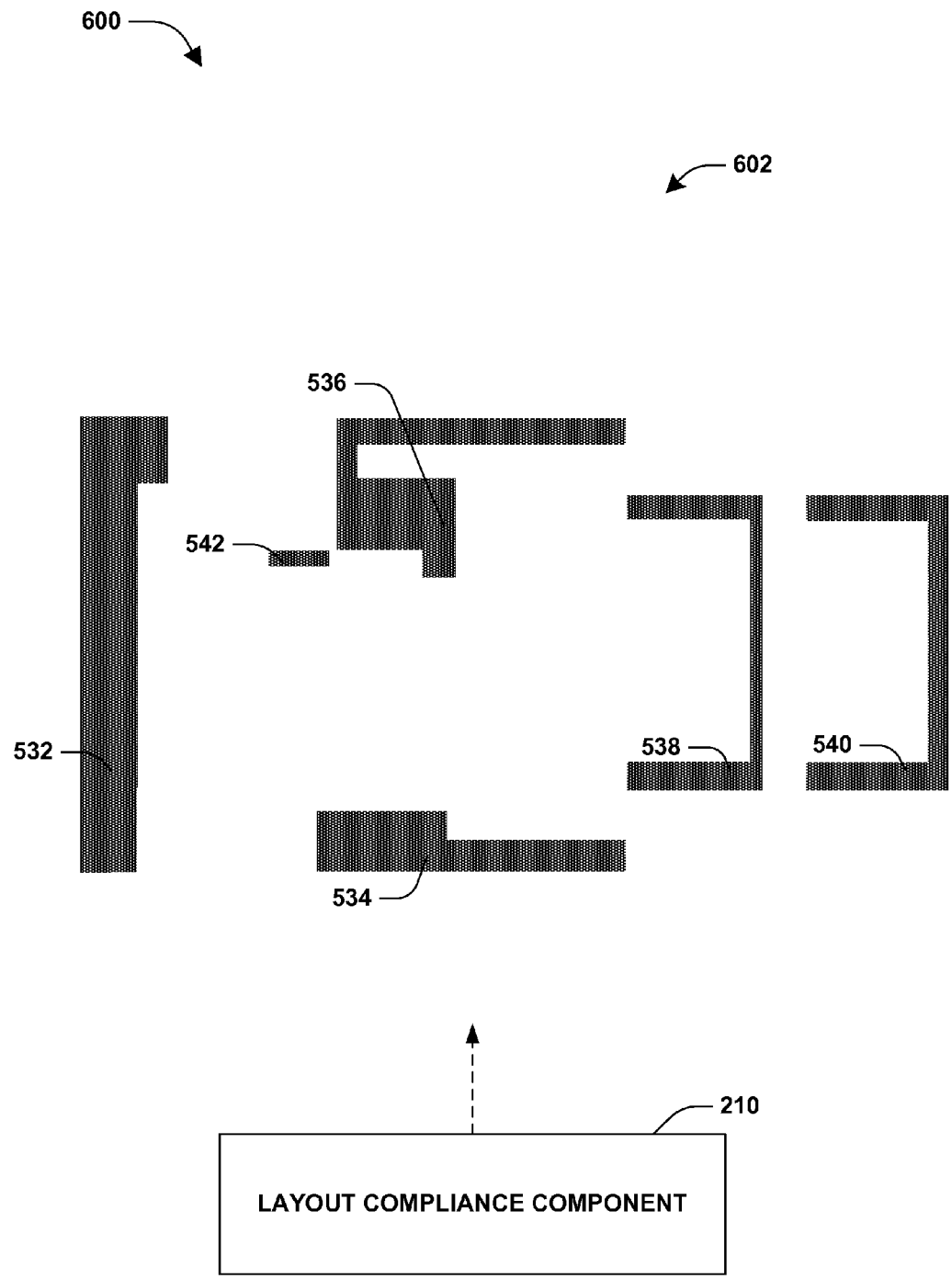
FIG. 6 is a simplified top-down views of a design layout, according to some embodiments.

At 108, an updated cut pattern 602 is generated based upon the modified initial design layout 502. In some embodiments, the layout compliance component 210 in example 530 of FIG. 5C is configured to generate the updated cut pattern 602 based upon unwanted regions of the modified initial design layout 502 that are not used to formed the electrical component during fabrication. For example, the updated cut pattern 602 comprises a first region 532, a second region 534, a third region 536, a fourth region 538, a fifth region 540, and a sixth region 542 that are to be removed during fabrication of the electrical component by one or more cut masks. In this way, the updated cut pattern 602 of FIG. 6 is generated, such as by the layout compliance component 210 in example 600 of FIG. 6. In an example, the updated cut pattern 602 corresponds to one or more cut masks, such as a first cut mask and a second cut mask used during fabrication.

Figure 7A:
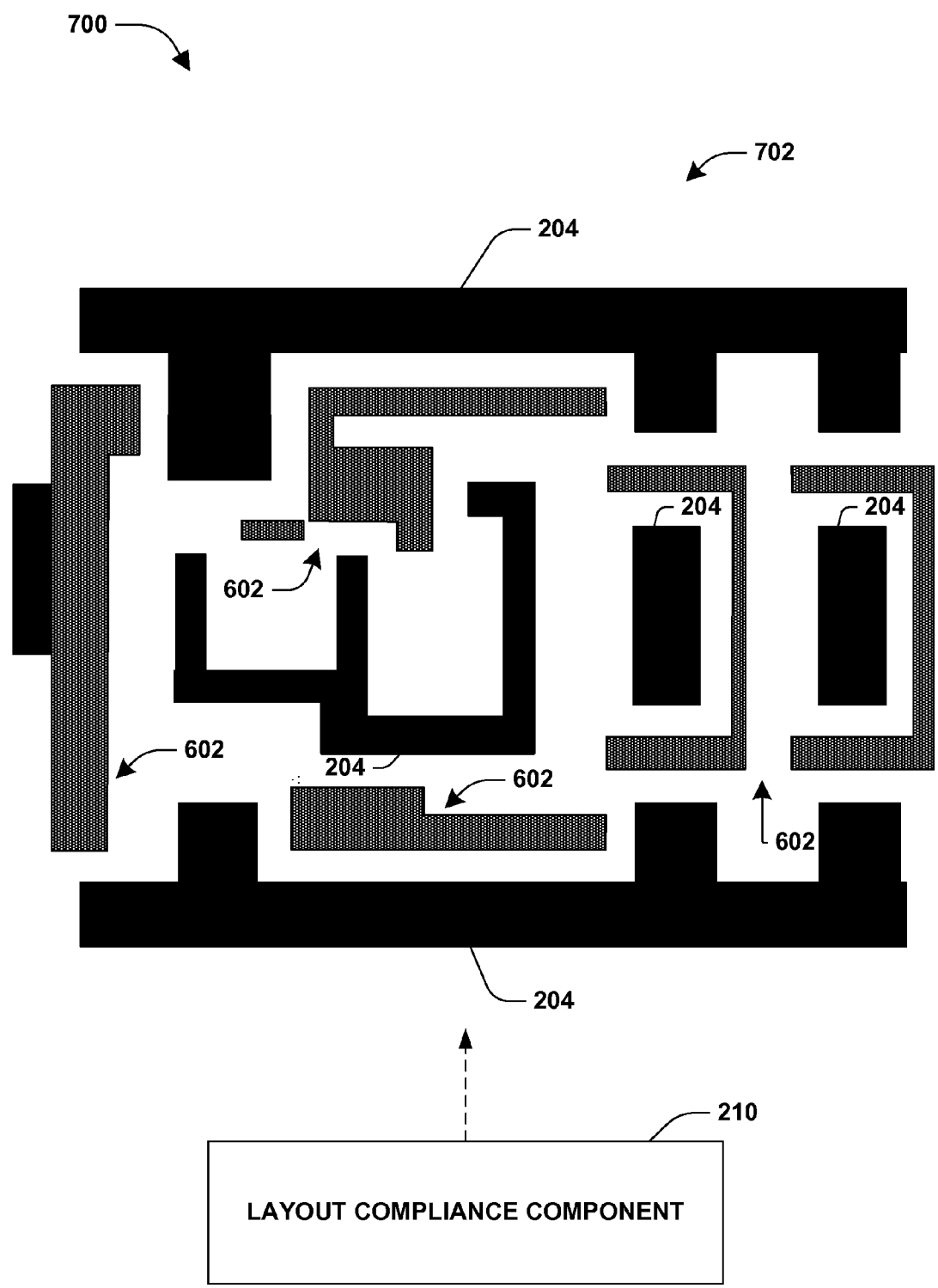
FIG. 7A is a simplified top-down views of a design layout, according to some embodiments.

At 110, the updated cut pattern 602 is applied to the modified initial design layout 502 to generate a final design layout 702. In an example, the final design layout 702, in example 700 of FIG. 7A, illustrates the second pattern 204, such as a mandrel pattern of the modified initial design layout 502 and the updated cut pattern 602. In this way, the final design layout 702 corresponds to one or more mandrel pattern masks and one or more cut masks used to fabricate the electrical component, but does not illustrate spacer or passive fill that is used to form the electrical component. In some embodiments, the layout compliance component 210 in example 700 of FIG. 7A is configured to generate the final design layout 702. In an example, the layout compliance component 210 verifies that the final design layout 702 is self-aligned multiple patterning (SAMP) compliant. In an example, the layout compliance component 210 is configured to generate a trim pattern based upon the updated cut pattern 602, and apply the trim pattern to the modified initial design 502 to generate the final design layout 702. The trim pattern corresponds to portions of the final design layout 702 that are retained during fabrication to form the electrical component.

Figure 7B:
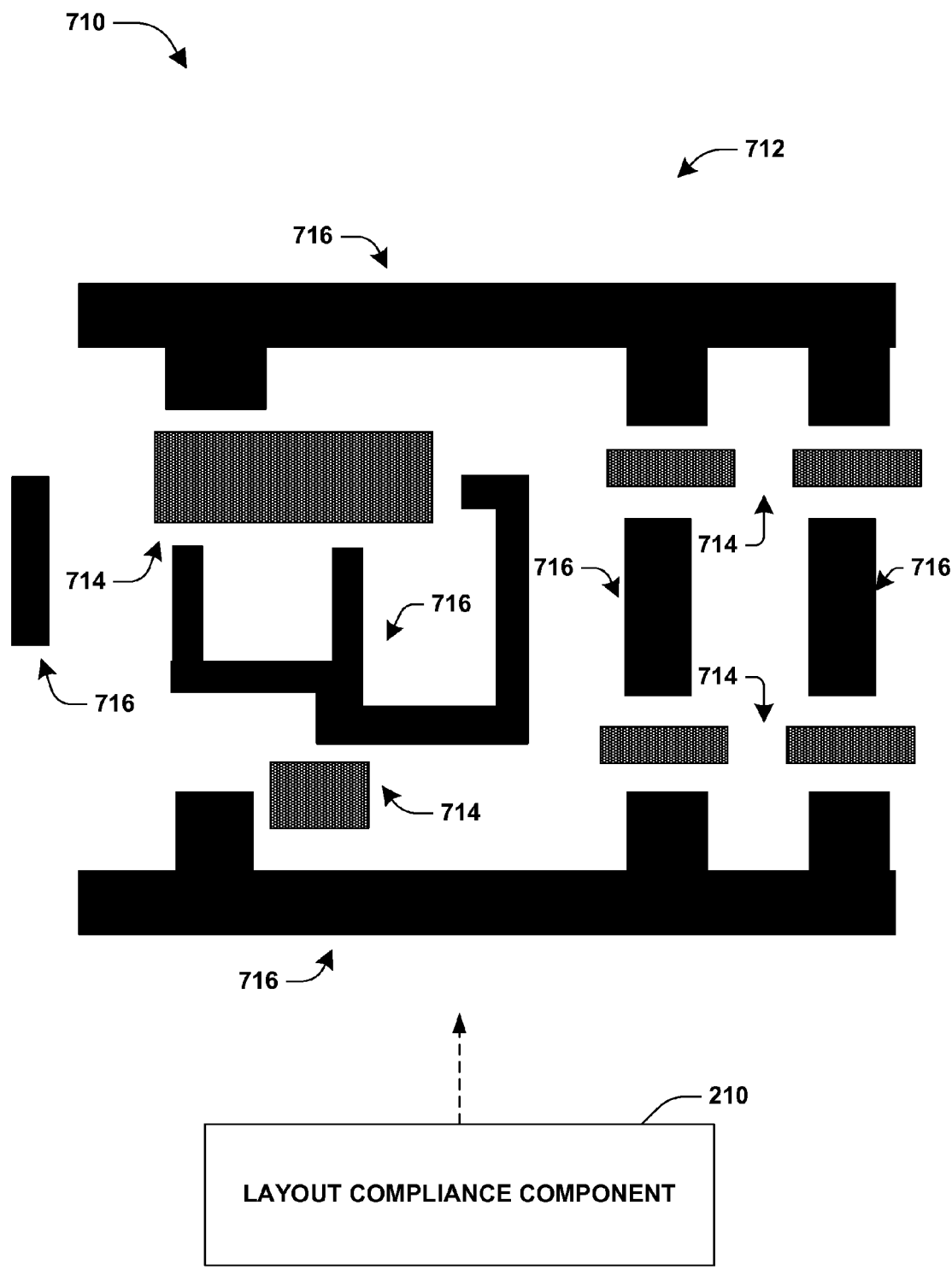
FIG. 7B is a simplified top-down views of a design layout, according to some embodiments.

In some embodiments, the layout compliance component 210 in example 710 of FIG. 7B is configured to modify at least one of the updated cut pattern 602 or the modified initial design layout 502. In an example, the layout compliance component 210 is configured to modify the updated cut pattern to create a final cut pattern 714 based upon at least one of a lithography aware optimization, an electrical-rule aware optimization, or an electric isolation rule between polygons within the modified design layout 502. In another example, the layout compliance component 210 is configured to modify the modified initial design layout 502, such as a modification to the second pattern 206 to create a final second pattern 716, based upon at least one of the lithography aware optimization, the electrical-rule aware optimization, or the electric isolation rule. In another example, the layout compliance component 210 is configured to define the final cut pattern 714 based upon the electrical isolation rule, such that the final cut pattern 714 comprises a first portion of the updated cut pattern 602, but not a second portion of the updated cut pattern 602, based upon the first portion providing desired electrical isolation between one or more polygons of a final design layout 712. The layout compliance component 210 is configured to define a remaining portion of the updated cut pattern 602, such as the second portion, as a passive fill pattern for the final design layout 712. The layout compliance component 210 applies the final cut pattern 714 to the modified initial design layout 502, such as the final second pattern 716, to generate the final design layout 712. In this way, the final design layout 712 corresponding to one or more mandrel masks and one or more cut masks used to fabricate the electrical component according to the final design layout 712. The final design layout 712 is verified as being SAMP compliant.

According to an aspect of the instant disclosure, a method for performing design layout is provided. The method comprises, receiving an initial design layout associated with an electrical component. The initial design layout comprises a first pattern associated with a first pattern process, such as a passive fill pattern process, and a second pattern associated with a second pattern process, such as a mandrel pattern process. An initial cut pattern for the initial design layout is generated. For example, the initial cut pattern corresponds to unwanted portions of the initial design layout that are not used to form the electrical component. Responsive to identifying a design rule violation associated with the initial cut pattern, such as a violation of a sizing constraint associated with a physical limitation of a cut mask, the initial design layout is modified to generate a modified initial design layout. For example, a shape or size of the first pattern or the second pattern is modified. An updated cut pattern, not resulting in the design rule violation, is generated based upon the modified initial design layout. The updated cut pattern is applied to the modified initial design layout to generate a final design layout.

According to an aspect of the instant disclosure, a system for performing design layout is provided. The system comprises a layout compliance component. The layout compliance component is configured to identify a mandrel pattern and a passive fill pattern within an initial design layout of an electrical component. The layout compliance component is configured to generate an initial cut pattern for the initial design layout. Responsive to identifying a design rule violation based upon a cut mask size constraint associated with the initial cut pattern, the layout compliance component modifies at least one of the mandrel pattern or the passive fill pattern to generate a modified initial design layout. The layout compliance component is configured to generate an updated cut pattern, not resulting in the design rule violation, based upon the modified initial design layout. The layout compliance component is configured to apply the updated cut pattern to the modified initial design layout to generate the final design layout.

According to an aspect of the instant disclosure, a computer-readable medium comprising instructions that perform a method for design layout is provided. The method comprises, receiving an initial design layout of an electrical component. The initial design layout comprises a mandrel pattern and a passive fill pattern. An initial trim pattern is generated for the initial design layout, such that the initial trim pattern corresponds to portions of the initial design layout that are to be retained during fabrication. Responsive to identifying a design rule violation associated with the initial trim pattern, such as a violation of a sizing constraint associated with a physical limitation of a cut mask, at least one of the mandrel pattern or the passive fill pattern is modified to generate a modified initial design layout. An updated trim pattern, not resulting in the design rule violation, is generated based upon the modified initial design layout. The updated trim pattern is applied to the modified initial design layout to generate a final design layout. The final design layout is verified as self-aligned multiple patterning (SAMP) compliant.

Figure 8:
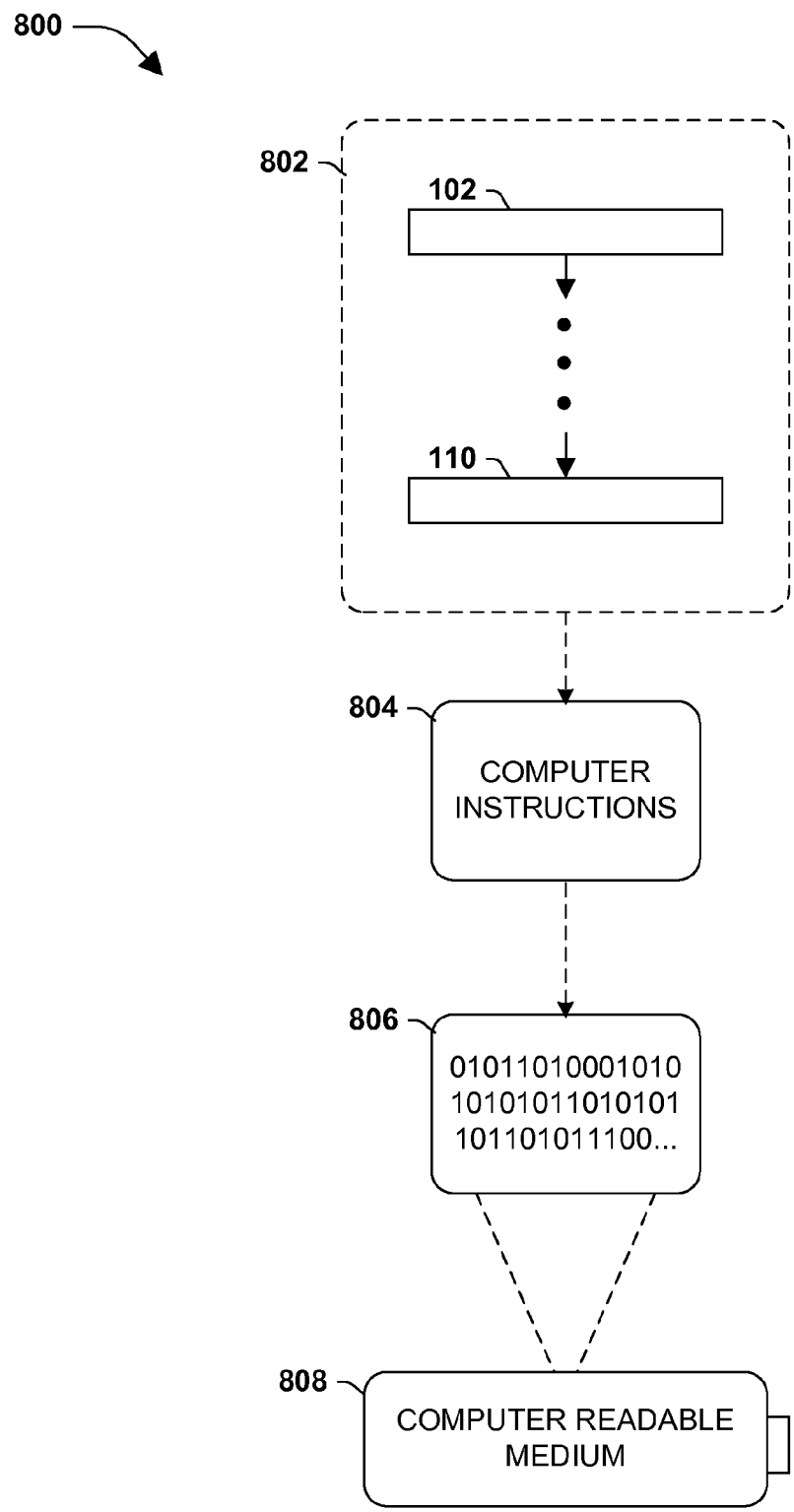
FIG. 8 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 8, wherein the implementation 800 comprises a computer-readable medium 808, such as a CD-R, DVD-R, flash drive, a platter of a hard disk drive, etc., on which is encoded computer-readable data 806. This computer-readable data 806, such as binary data comprising at least one of a zero or a one, in turn comprises a set of computer instructions 804 configured to operate according to one or more of the principles set forth herein. In some embodiments, the processor-executable computer instructions 804 are configured to perform a method 802, such as at least some of the exemplary method 100 of FIG. 1, for example. In some embodiments, the processor-executable instructions 804 are configured to implement a system, such as at least some of a system comprising the layout compliance component 210 of FIGS. 2-7B, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component includes a process running on a processor, a processor, an object, an executable, a thread of execution, a program, or a computer. By way of illustration, both an application running on a controller and the controller can be a component. One or more components residing within a process or thread of execution and a component is localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 9:
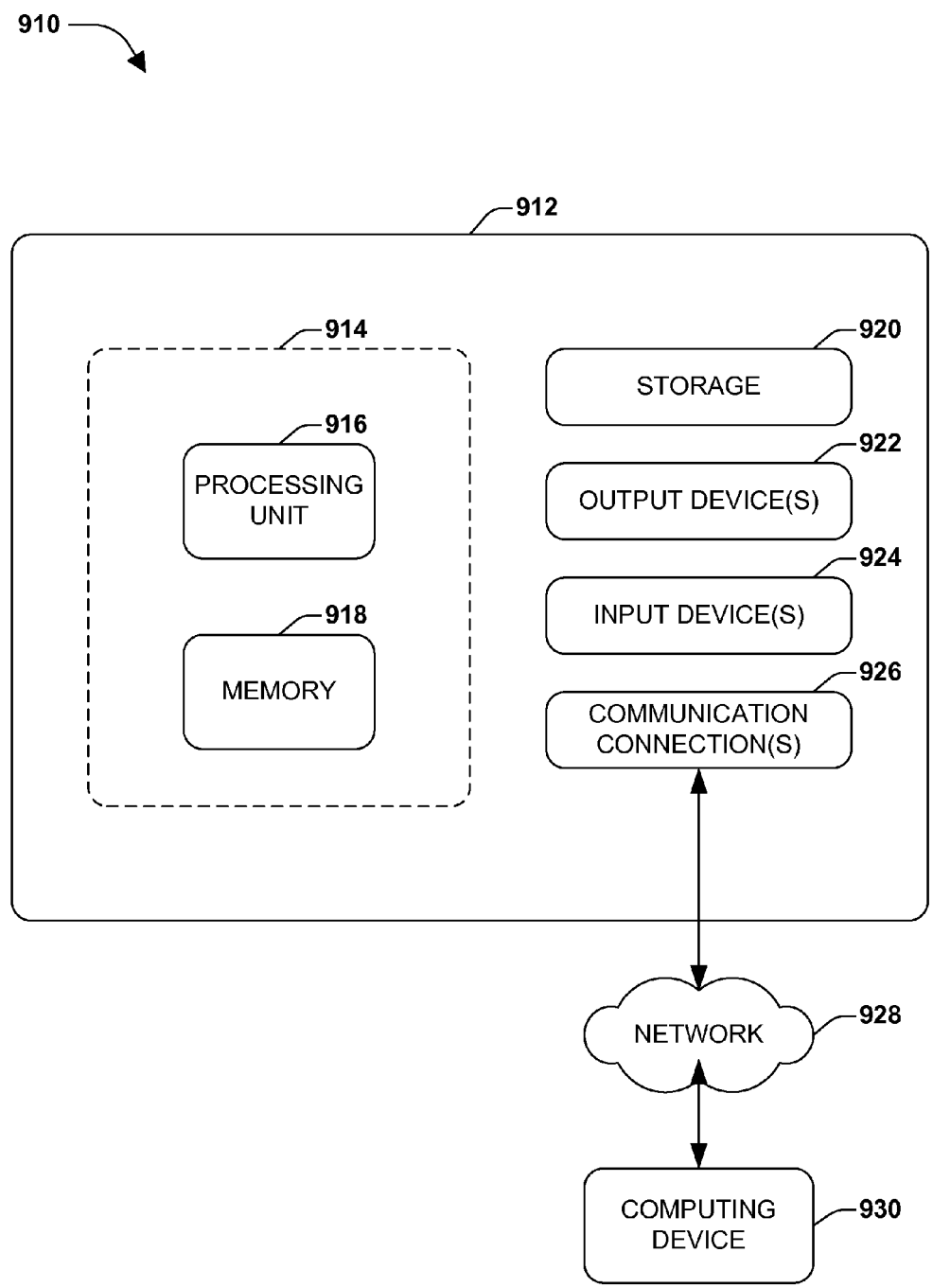
FIG. 9 illustrates an example computing environment wherein one or more of the provisions set forth herein may be implemented.

FIG. 9 and the following discussion provide a brief, general description of a suitable computing environment to implement embodiments of one or more of the provisions set forth herein. The operating environment of FIG. 9 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 9 illustrates an example of a system 900 comprising a computing device 912 configured to implement one or more embodiments provided herein. In one configuration, computing device 912 includes at least one processing unit 916 and memory 918. In some embodiments, depending on the exact configuration and type of computing device, memory 918 is volatile, such as RAM, non-volatile, such as ROM, flash memory, etc., or some combination of the two. This configuration is illustrated in FIG. 9 by dashed line 914.

In other embodiments, device 912 includes additional features or functionality. For example, device 912 also includes additional storage such as removable storage or non-removable storage, including, but not limited to, magnetic storage, optical storage, and the like. Such additional storage is illustrated in FIG. 9 by storage 920. In some embodiments, computer readable instructions to implement one or more embodiments provided herein are in storage 920. Storage 920 also stores other computer readable instructions to implement an operating system, an application program, and the like. Computer readable instructions are loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 912. Any such computer storage media is part of device 912.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 912 includes input device(s) 924 such as keyboard, mouse, pen, voice input device, touch input device, infrared cameras, video input devices, or any other input device. Output device(s) 922 such as one or more displays, speakers, printers, or any other output device are also included in device 912. Input device(s) 924 and output device(s) 922 are connected to device 912 via a wired connection, wireless connection, or any combination thereof. In some embodiments, an input device or an output device from another computing device are used as input device(s) 924 or output device(s) 922 for computing device 912. Device 912 also includes communication connection(s) 926 to facilitate communications with one or more other devices.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as implanting techniques, doping techniques, spin-on techniques, sputtering techniques such as magnetron or ion beam sputtering, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for performing design layout, comprising:
receiving an initial design layout of an electrical component, the initial design layout comprising a first pattern for forming a first set of one or more polygons and associated with a mandrel pattern process that utilizes a first pattern mask and a second pattern for forming a second set of one or more polygons and associated with a passive fill pattern process that utilizes a second pattern mask different than the first pattern mask;
generating an initial cut pattern for the initial design layout based upon the first pattern and the second pattern;
responsive to identifying a design rule violation associated with the initial cut pattern, modifying the initial design layout to generate a modified initial design layout, comprising applying a passive pattern addition to a first polygon of the second set;
generating an updated cut pattern based upon the modified initial design layout; and
applying the updated cut pattern to the modified initial design layout to generate a second design layout, at least some of the method implemented at least in part via a processing unit.

2. The method of claim 1, the applying a passive pattern addition comprising:
applying the passive pattern addition to the first polygon to modify at least one of a shape or size of the first pattern.

3. The method of claim 1, the modifying the initial design layout comprising:
modifying at least one of a shape or size of the second pattern.

4. The method of claim 1, the modifying the initial design layout comprising:
inserting an assist mandrel into the initial design layout.

5. The method of claim 1, at least one polygon of the first set surrounded by a spacer.

6. The method of claim 1, comprising:
generating a trim pattern based upon the updated cut pattern, and the applying the updated cut pattern comprising:
applying the trim pattern to the modified initial design layout to generate the second design layout.

7. The method of claim 1, comprising:
verifying the second design layout as self-aligned multiple patterning (SAMP) compliant.

8. The method of claim 1, the receiving an initial design layout comprising:
receiving a multiple-patterning technology (MPT) compliant layout;
decomposing the MPT compliant layout into two or more pattern groups;

assigning a first pattern group to the mandrel pattern process to generate the first pattern; and
assigning a second pattern group to the passive fill pattern process to generate the second pattern.

9. The method of claim 1, comprising:
applying a mandrel pattern addition to a second polygon of the first set.

10. The method of claim 1, comprising:
identifying the design rule violation based upon one or more constraints associated with a physical limitation of a cut mask corresponding to the initial cut pattern.

11. The method of claim 1, comprising:
modifying the updated cut pattern based upon at least one of a lithography aware optimization or an electrical-rule aware optimization.

12. The method of claim 1, comprising:
defining a spacer within the initial design layout.

13. The method of claim 1, comprising:
representing the updated cut pattern utilizing a first cut mask and a second cut mask.

14. A system for performing design layout, comprising:
a layout compliance component implemented at least in part via a processing unit and configured to:
identify a mandrel pattern for forming a first set of one or more polygons via a first mask and a passive fill pattern for forming a second set of one or more polygons via a second pattern mask different than the first pattern mask within an initial design layout of an electrical component;
generate an initial cut pattern for the initial design layout;
responsive to identifying a design rule violation based upon one or more constraints associated with the initial cut pattern, modify the passive fill pattern by applying a passive pattern addition to a first polygon of the second set to generate a modified initial design layout;
generate an updated cut pattern based upon the modified initial design layout; and
apply the updated cut pattern to the modified initial design layout to generate a second design layout.

15. The system of claim 14, the layout compliance component configured to:
insert an assist mandrel into the initial design layout to generate the modified initial design layout.

16. The system of claim 14, the mandrel pattern surrounded by spacer.

17. The system of claim 14, the layout compliance component configured to:
define a second cut pattern based upon an electrical isolation rule between polygons within the modified initial design layout, the second cut pattern comprising a first portion of the updated cut pattern; and
define a second portion of the updated cut pattern as the passive fill pattern.

18. The system of claim 17, the layout compliance component configured to:
represent the second cut pattern using a first cut mask and a second cut mask.

19. The system of claim 14, the layout compliance component configured to:
modify the updated cut pattern based upon at least one of a lithography aware optimization or an electrical-rule aware optimization.

20. A non-transitory computer-readable medium comprising processor-executable instructions that when executed perform a method for design layout, comprising:

receiving an initial design layout of an electrical component, the initial design layout comprising a mandrel pattern for forming a first set of one or more polygons via a first mask and a passive fill pattern for forming a second set of one or more polygons via a second pattern mask different than the first pattern mask;

generating an initial trim pattern for the initial design layout;

responsive to identifying a design rule violation associated with the initial trim pattern, modifying the passive fill pattern by applying a passive pattern addition to a first polygon of the second set to generate a modified initial design layout;

generating an updated trim pattern based upon the modified initial design layout;

applying the updated trim pattern to the modified initial design layout to generate a second design layout; and verifying the second design layout as self-aligned multiple patterning (SAMP) compliant.

\* \* \* \* \*